(12) United States Patent
Wilson et al.

(10) Patent No.: US 8,137,065 B2
(45) Date of Patent: Mar. 20, 2012

(54) AEROGENERATOR HAVING MEANS FOR MAINTAINING VANE UNIT HORIZONTAL

(76) Inventors: Chris Wilson, Portland, OR (US); John Nelson, Portland, OR (US); Michael Baker, Gig Harbor, WA (US)

(*) Notice: Subject to any disclaimer, the term of this patent is extended or adjusted under 35 U.S.C. 154(b) by 653 days.

(21) Appl. No.: 12/275,031

(22) Filed: Nov. 20, 2008

(65) Prior Publication Data

US 2010/0111694 A1    May 6, 2010

(30) Foreign Application Priority Data

Nov. 5, 2008    (KR) .................. 10-2008-0109351

(51) Int. Cl.
*F03D 3/06* (2006.01)
(52) U.S. Cl. ............................................. 416/17
(58) Field of Classification Search .............. 415/4.3, 415/4.2, 4; 416/17, 11, 12, 197 A, 132 B, 416/142, 144
See application file for complete search history.

(56) References Cited

FOREIGN PATENT DOCUMENTS

| KR | 20-0379582 | 3/2005 |
|---|---|---|
| WO | WO 2008/111841 | 9/2008 |

*Primary Examiner* — Alexander Gilman
(74) *Attorney, Agent, or Firm* — Sherr & Vaughn, PLLC

(57) ABSTRACT

Disclosed herein is an aerogenerator having a horizontal maintaining means. The aerogenerator of the present invention includes a support pillar which is placed upright on the ground and has a hollow space therein. The aerogenerator further includes a rotational support unit which is provided on the upper end of the support pillar so as to be rotatable. The rotational support unit includes a rotational body and a rotational support base which supports the lower end of the rotational body. The opposite ends of the rotational support base extend predetermined lengths from the rotational body outwards. The aerogenerator further includes vane units which include a main vane and a subsidiary vane provided on the respective opposite ends of the rotational support base of the rotational support unit. The main vane and the subsidiary vane have different weights. The aerogenerator further includes a generating unit which converts the rotating force of the vane units into electric energy, a rotating force transmission unit which transmits the rotating force of the vane units to the generating unit, and the horizontal maintaining means which connects the vane units to the rotational body to maintain central axes of rotating shafts of the vane units horizontal.

3 Claims, 6 Drawing Sheets

US 8,137,065 B2

AEROGENERATOR HAVING MEANS FOR MAINTAINING VANE UNIT HORIZONTAL

The present application claims priority to Korean Patent Application No. 10-2008-0109351 (filed on Nov. 5, 2008) which is hereby incorporated by reference in its entirety.

BACKGROUND OF THE INVENTION

1. Field of the Invention

The present invention relates generally to aerogenerators and, more particularly, to an aerogenerator which includes a horizontal maintaining means for preventing opposite ends of a rotational support unit, on which vanes are provided, from being deflected downwards by the weight of the vanes, so that central axes of rotating shafts of the vanes can be maintained horizontal, thus maintaining the rotating force of the vanes constant, thereby producing a satisfactory amount of electric energy.

2. Description of the Related Art

As well known to those skilled in the art, aerogenerators are one kind of generators which obtain rotating force in such a way as to rotate vanes using naturally-occurring wind, convert the rotating force into electric energy, and supply the produced electricity to areas where it is needed.

Such an aerogenerator includes a support pillar, rotational bodies and vanes. The support pillar is placed upright on the ground.

The rotational bodies are rotatably provided on the respective opposite ends of the upper part of the support pillar. The vanes are supported by the respective rotational bodies and generate rotating force using the wind.

Recently, aerogenerators have been used which include a pair of vanes and which are constructed such that their rotational bodies are rapidly rotated in the direction in which the wind is blowing so as to increase rotating force of the vanes.

FIG. 1 is a view illustrating a conventional aerogenerator.

As shown in the drawing, the conventional aerogenerator 1 includes a support pillar 10 which is placed upright on the ground, a rotational body 20 which is rotatably provided on the upper end of the support pillar 10, and two vanes 30 which are rotatably provided on the respective opposite ends of the rotational body 20.

Furthermore, a generating unit 40 is provided in the support pillar 10 or on the ground. A rotating force transmission unit 50 which increases the rotating force of the vanes 30 and transmits it to the generating unit 40 is provided in the rotational body 20.

The transmission unit 50 is disposed at an upper position in the central portion of the rotational body 20 and connects rotating shafts 32 of the vanes 30 to a rotating shaft 42 connected to the generating unit 40. The transmission unit 50 is protected by a cover 22.

A rolling unit 60 is provided between the rotational body 20 and the support pillar 10. The rolling unit 60 includes a rotating plate 62 and a plurality of rollers 64 which are provided on the rotating plate 62 and arranged in a circumferential direction. Thus, the rotational body 20 is supported on the upper end of the support pillar 10 so as to be rotatable using the rolling unit 60.

Due to the above-mentioned construction, the rotational body 20 having the vanes 30 is easily rotated in the direction in which the wind blows, so that the rotating force of the vanes 30 can be increased, thus enhancing the amount of produced electric energy.

However, in the conventional aerogenerator 1, the rotating shaft 32 of each vane 30 is supported only by the cover 22 and the corresponding end of the rotational body 20. Therefore, the rotating shaft 32 may be deflected downwards by the weight of the vane 30. In this case, there is a problem in that satisfactorily constant rotating force cannot be generated.

In particular, if the vane 30 is rotated when the rotating shaft thereof is not in the horizontal state, that is, it is in a downward deflected state, the vane 30 may be damaged or undesirably removed from the rotational body 20, with the result that a high-risk accident may occur.

SUMMARY OF THE INVENTION

Accordingly, the present invention has been made keeping in mind the above problems occurring in the related art, and an object of the present invention is to provide an aerogenerator which can maintain a vane unit horizontal in such a way as to pull and support the vanes towards the central portion of a rotational support unit using the horizontal maintaining means.

Another object of the present invention is to provide an aerogenerator in which opposite ends of a rotational support base of the rotational support unit which supports the lower ends of the vanes are slightly bent inwards to firmly support the weight of the vanes, thus maintaining the vane unit horizontal more reliably.

Therefore, the aerogenerator having a means for maintaining a vane unit horizontal according to the present invention can ensure satisfactorily enhanced rotating force of the vanes, thus increasing the amount of produced electric energy.

In order to accomplish the above object, the present invention provides an aerogenerator, including: a support pillar placed upright on a ground, the support pillar having a hollow space therein, with a support extension extending a predetermined distance from an upper end of the support pillar inwards such that the hollow space is open on the upper end of the support pillar through a center of the support extension; a rotational support unit provided on the upper end of the support pillar so as to be rotatable, the rotational support unit including a rotational body having a space therein, and a rotational support base supporting a lower end of the rotational body and having opposite ends extending predetermined lengths from the rotational body outwards; a vane unit including a main vane and a subsidiary vane provided on the respective opposite ends of the rotational support base of the rotational support unit, the main vane and the subsidiary vane being rotated by wind and having different weights; a generating unit to convert rotating force transmitted from the vane unit into electric energy; a rotating force transmission unit to transmit the rotating force of the vane unit to the generating unit; and a horizontal maintaining means for connecting the vane unit to the rotational body to maintain a central axis of a rotating shaft of the vane unit horizontal.

Preferably, the horizontal maintaining means may comprise a wire having at least one strand, the wire being coupled at a first end thereof to the rotational body of the rotational support unit so as to be rotatable, and being coupled at a second end thereof to a predetermined portion of the vane unit fastened to the rotational support base, wherein a length of the wire is adjusted by a length adjustment unit, thus maintaining the central axis of the rotating shaft of the vane unit.

Alternatively, the horizontal maintaining means may comprise: a first wire having at least one strand, the first wire being fastened to the rotational body of the rotational support unit; a second wire having at least one strand, the second wire being fastened to a predetermined portion of the vane unit fastened to the rotational support base; and a length adjustment unit connecting the first wire to the second wire, the length adjustment unit pulling or loosening the first wire and the second wire in a longitudinal direction using rotation thereof, thus adjusting an entire length of the first and second wires, so that the central axis of the rotating shaft of the vane unit is maintained horizontal by rotating the length adjustment unit.

The rotational support base of the rotational support unit may be bent inwards, so that when the rotational body and the vane unit are coupled to the rotational support base, the rotational support base supports the weight of the vane unit such that the central axis of the rotating shaft of the vane unit is maintained horizontal.

Furthermore, when one of the main and subsidiary vanes is placed on one end of the rotational support base which is in the horizontal state, a deflection (y) of the end of the rotational support base may be expressed by a formula:

$$y = \frac{Fx^2}{6EI}(x - 3l)$$

(wherein F denotes a weight of the one selected vane, E denotes Young's modulus, I denotes an area moment of inertia, and l denotes a length of the rotational support base), wherein the end of the rotation support base may be bent upwards by the deflection (y).

The rotational support base may be constructed such that bending rates of the opposite ends thereof differ from each other, based on a medial portion of the rotational support base on which the rotational body is provided, and wherein a bending rate of one end of the rotational support base which supports thereon the main vane which is heavier than the subsidiary vane may be greater than a bending rate of a remaining end of the rotational support base which supports the subsidiary vane.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the attached drawings.

The preferred embodiments of the present invention do not limit the bounds of the present invention but are only for illustrative purposes, and various modifications, additions and substitutions are possible, without departing from the scope and spirit of the invention.

Figure 1:
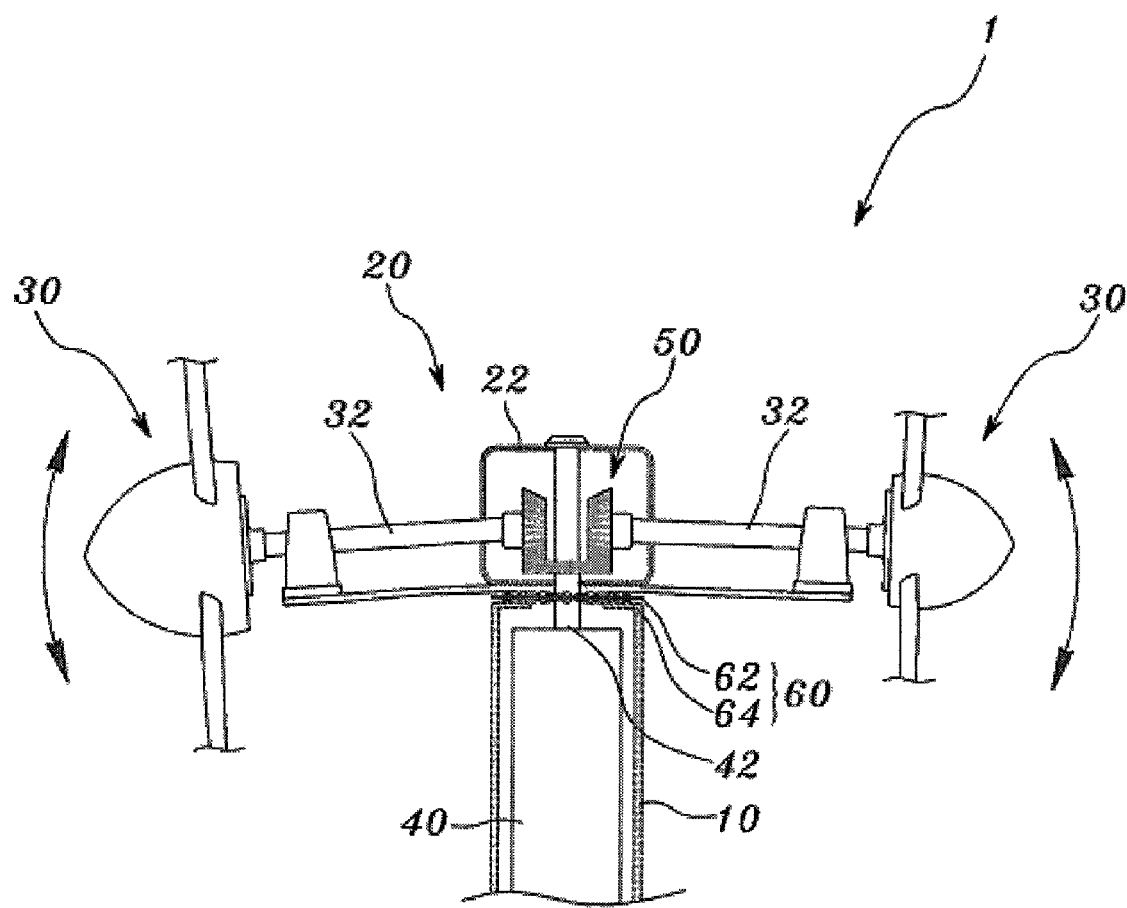
FIG. 1 is a view illustrating a conventional aerogenerator.
Figure 2:
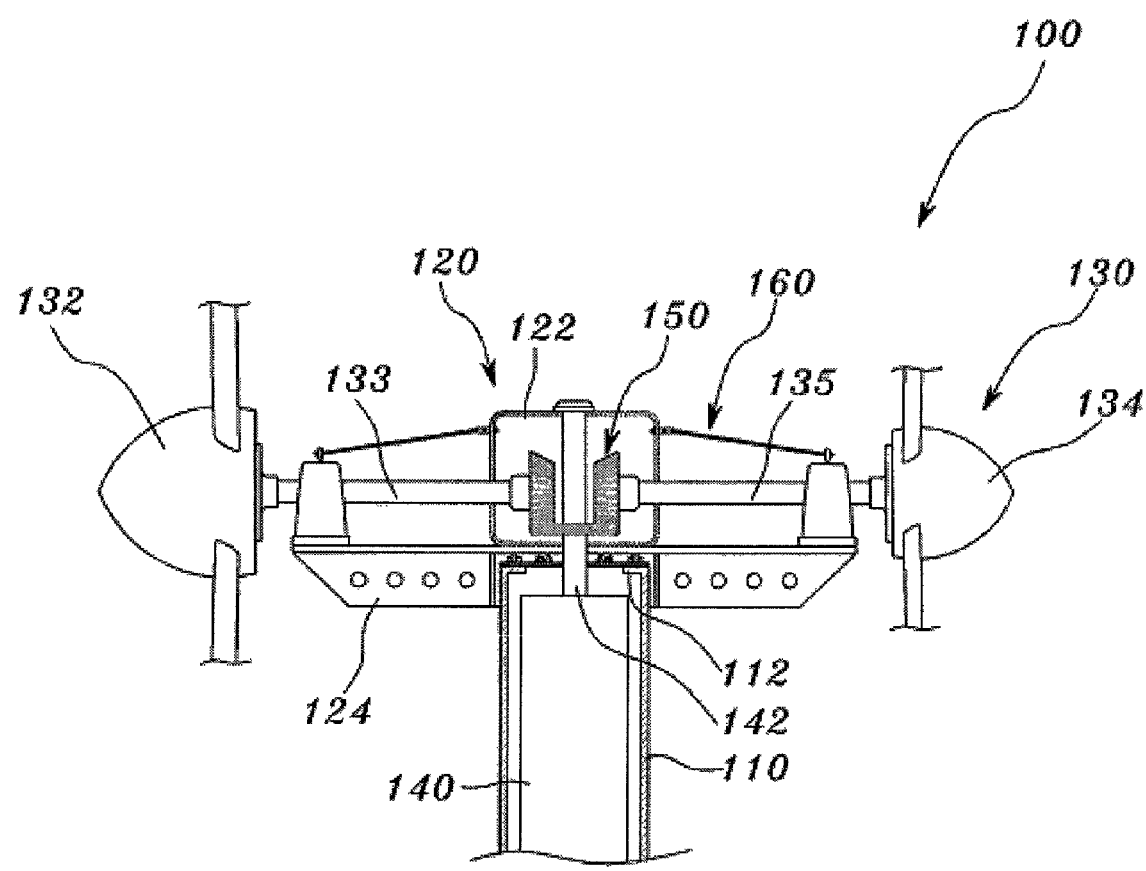
FIG. 2 is a view illustrating an aerogenerator having a means for maintaining a vane unit horizontal, according to the present invention.
Figure 3:
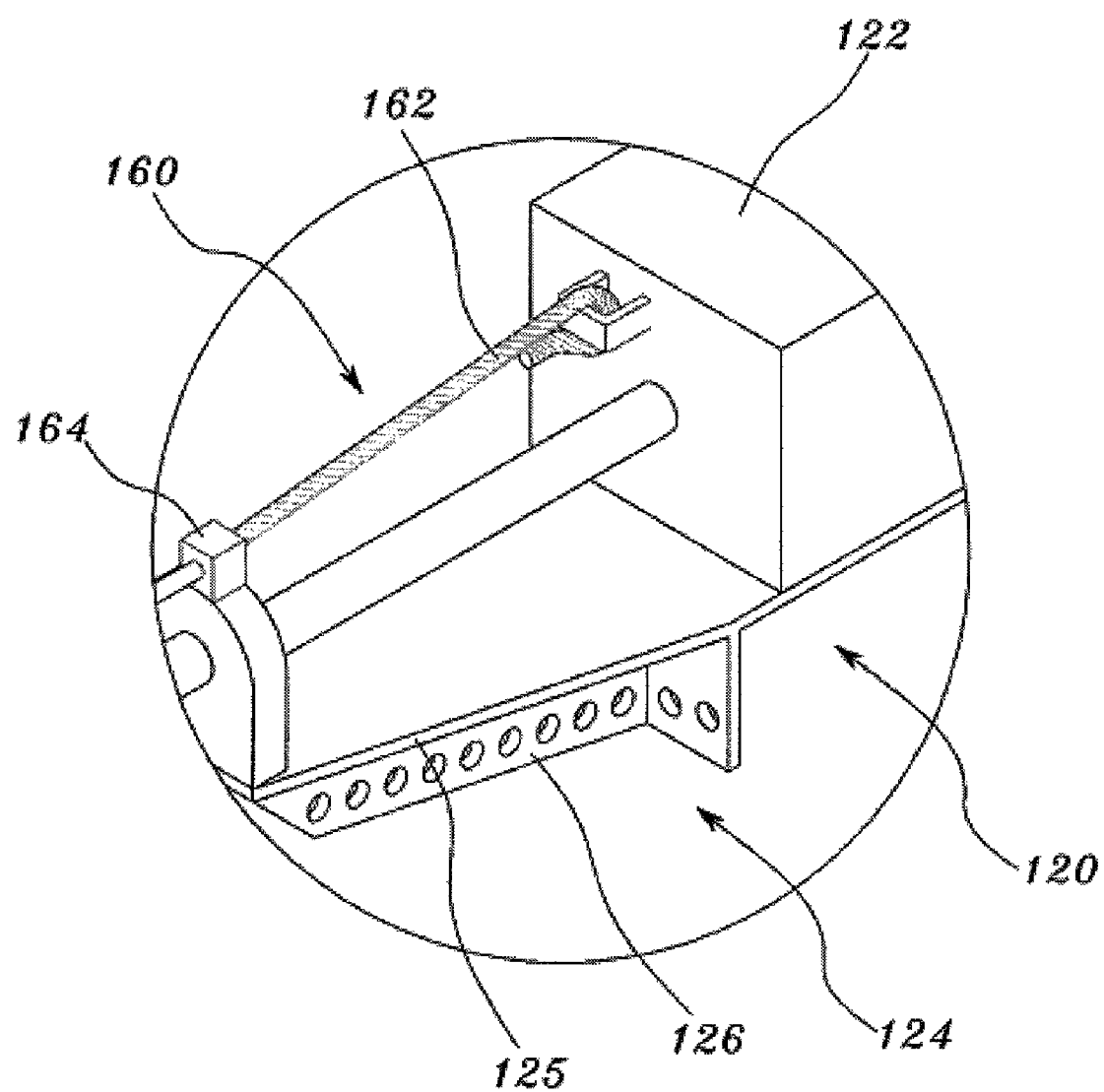
FIG. 3 is a view showing an embodiment of the horizontal maintaining means of the aerogenerator according to the present invention.
Figure 4:
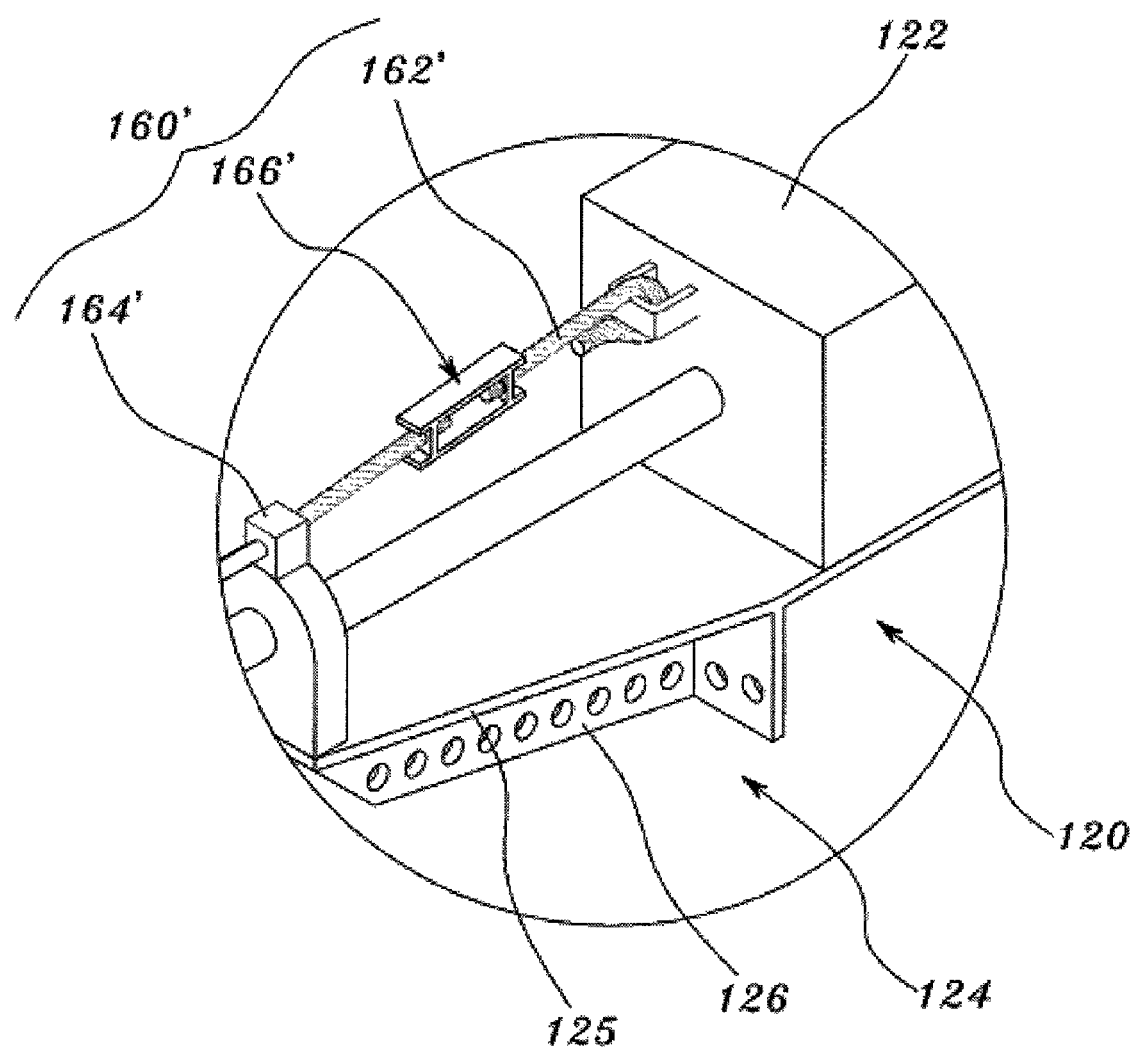
FIG. 4 is a view showing another embodiment of the horizontal maintaining means of the aerogenerator according to the present invention.
Figure 5:
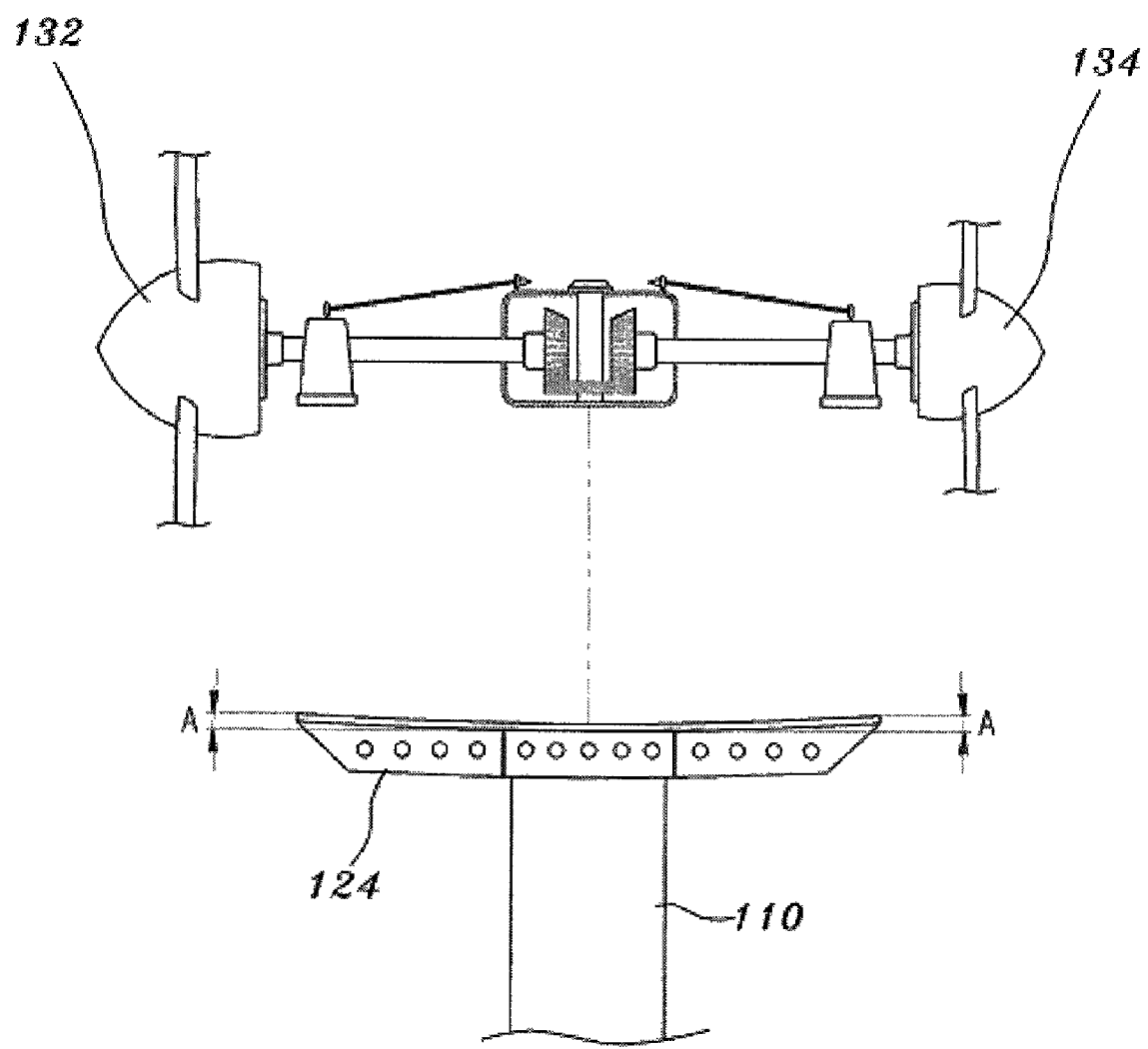
FIG. 5 is a view showing an embodiment of a rotational support base of the aerogenerator according to the present invention.
Figure 6:
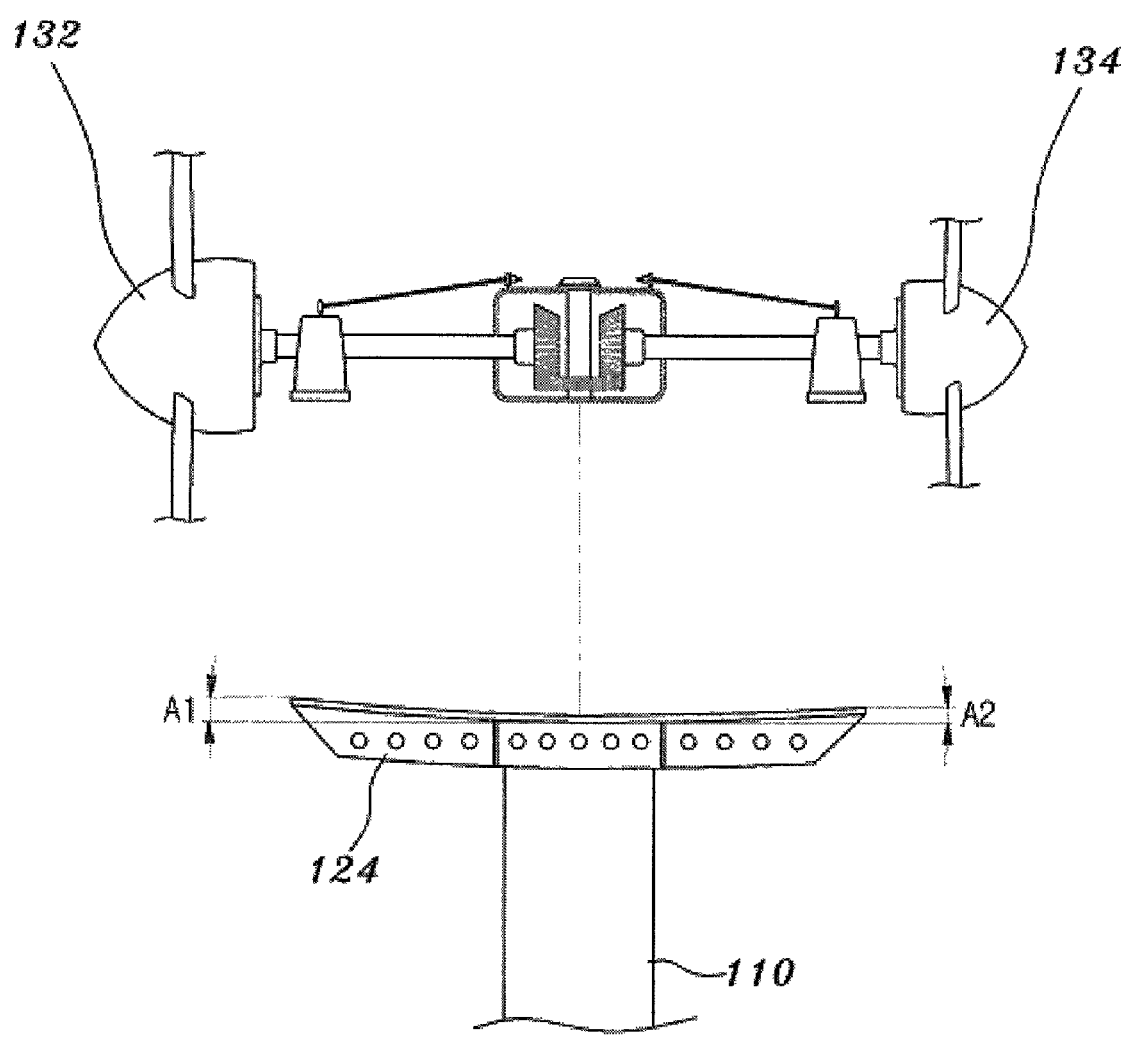
FIG. 6 is a view showing another embodiment of a rotational support base of the aerogenerator according to the present invention.

FIG. 2 is a view illustrating an aerogenerator 100 having a means for maintaining a vane unit horizontal, according to the present invention. FIG. 3 is a view showing an embodiment of the horizontal maintaining means of the aerogenerator 100 according to the present invention. FIG. 4 is a view showing another embodiment of the horizontal maintaining means of the aerogenerator 100 according to the present invention. FIG. 5 is a view showing an embodiment of a rotational support base 124 of the aerogenerator 100 according to the present invention. FIG. 6 is a view showing another embodiment of a rotational support base 124 of the aerogenerator according to the present invention.

As shown in the drawings, the aerogenerator 100 according to the present invention includes a support pillar 110, a rotational support unit 120, vane units 130, a generating unit 140, a rotating force transmission unit 150 and the horizontal maintaining means 160.

The support pillar 110 is placed upright on the ground. The support pillar 110 has therein a hollow space which is open on the upper end thereof. A support extension 112 extends from the upper end of the support pillar 110 towards the central axis thereof. The rotational support unit 120 is rotatable on the upper surface of the support extension 112 around the central axis of the support pillar 110.

The rotational support unit 120 includes a rotational body 122 and a rotational support base 124. The rotational body 122 is provided on the medial portion of the upper surface of the rotational support base 124 and has the rotating force transmission unit 150 therein.

In other words, the rotational support base 124 supports the rotational body 122 thereon and the opposite ends thereof extend predetermined lengths from the rotational body 122 outwards. The vane units 130 are provided on the respective opposite ends of the rotational support base 124 which extend predetermined lengths outwards.

Due to this construction, the rotational support unit 120 can be easily rotated in a direction in which the wind is blowing, so that the vane units 130 can face the direction in which the wind is blowing. Thus, the vane units 130 can be more effectively rotated.

The vane units 130 include a main vane 132 and a subsidiary vane 132. The main vane 132 is larger than the subsidiary vane 132.

The generating unit 140 is installed in the support pillar 110 or provided on the ground to convert a rotating force transmitted from the vane units 130 into electrical energy. The rotating force transmission unit 150 functions to transmit rotating force of the vane units 130 to the generating unit 140.

The rotating force transmission unit 150 is provided in the rotational body 122 of the rotational support unit 120 and connects rotating shafts 133 and 135 of the main and subsidiary vanes 132 and 134 to a rotating shaft 142 of the generating unit 140 such that the rotating force of the vane unit 130 is perpendicularly transmitted to the generating unit 140.

The horizontal maintaining means 160 enables the vane units 130 to rotate in the horizontal state. In other words, the horizontal maintaining means 160 maintains the central axes of the rotating shafts 133 and 135 of the vane units 130 horizontal, so that the vane units 130 can be smoothly rotated, thus maximizing the rotating force thereof for generating electrical energy.

As shown in FIGS. 2 and 3, the horizontal maintaining means 160 comprises a wire 162, which has at least one strand and couples the rotational support unit 120 to the corresponding vane unit 130.

In detail, a first end of the wire 162 of the horizontal maintaining means 160 is rotatably connected to the rotational body 122 of the rotational support unit 120, and a second end thereof is connected to a predetermined portion of the corresponding vane unit 130 which is supported by the rotational support base 124. Here, the length of the wire 162 is adjusted by a length adjustment unit 164 such that the central axis of the rotating shaft 133, 135 of the corresponding vane unit 130 is maintained horizontal.

The length adjustment unit 164 which adjusts the length of the wire 162 to maintain the vane unit 130 horizontal is provided on the portion of the vane unit 130 to which the second end of the wire 162 is coupled.

Meanwhile, as shown in FIG. 4, a horizontal maintaining means 160' may be used as another embodiment. The horizontal maintaining means 160' includes a first wire 162', a second wire 164' and a length adjustment unit 166'.

Each of the first wire 162' and the second wire 164' comprises a wire which has at least one strand. The first wire 162' is fastened at one end thereof to the rotational body 122 of the rotational support unit 120, and the second wire 164' is fastened at one end thereof to a predetermined portion of the corresponding vane unit 130 which is supported by the rotational support base 124.

The length adjustment unit 166' connects free ends of the first wire 162' and the second wire 164' to each other. The length adjustment unit 166' pulls or loosens the first wire 162' and the second wire 164' in the longitudinal direction using rotation thereof, thus adjusting the entire length of the horizontal maintaining means 160'.

The length adjustment unit 166' is rotated around a connection line which connects coupling points, at which the first wire 162' and the second wire 164' are coupled to the length adjustment unit 166'. The lengths of the first wire 162' and the second wire 164' are adjusted by rotating the length adjustment unit 166', thereby maintaining the vane unit 130 horizontal.

Here, because the vane units 130 include the main vane 132 and the subsidiary vane 134 which have different sizes and weights, support forces with which the main and subsidiary vanes 132 and 134 are maintained horizontal differ from each other, of course.

Preferably, as shown in FIGS. 5 and 6, the rotational support base 124 of the rotational support unit 120 is slightly bent upwards so as to sustain the weight of the vane units 130 which are coupled to the rotational body 122, thus maintaining the rotating shafts 133 and 135 of the vane units 130 horizontal more reliably.

Here, a bending rate A of each of the opposite ends of the rotational support base 124 means a degree to which the end of the rotational support base is bent upwards in response to a deflection y, whereby when the vane units 130 and the rotational body 122 are placed on the rotational support base that is in the horizontal state, the rotational support base is deflected downwards.

The deflection y is expressed by the following formula:

$$y = \frac{Fx^2}{6EI}(x - 3l)$$

Here, F denotes a weight of one selected vane, E denotes Young's modulus, I denotes an area moment of inertia, and l denotes a length of the rotational support base.

In other words, one end of the rotational support base 124 is constructed such that it is bent upwards to a degree corresponding to a deflection y obtained when one vane is placed on the end of the rotational support base 124 which is in the horizontal state.

Therefore, as shown in FIG. 6, preferably, bent rates A1 and A2 of the opposite ends of the rotational support base 124 differ from each other, based on the medial portion of the rotational support base 124 on which the rotational body 122 is provided.

In detail, a bending rate A1 of the one end of the rotational support base 124 which supports thereon, of the vane units 130, the main vane 132 having a comparatively heavy weight is greater than a bending rate A2 of a remaining end of the rotational support base 124 which supports thereon the subsidiary 134 having a light weight.

Due to this construction, the main vane 132 and the subsidiary vane 134 which have different weights are supported by different support forces, so that the horizontal state thereof can be maintained more easily. As a result, rotating force of the vane units 130 can be reliably ensured, thus increasing the amount of produced electric energy.

The rotational support base 124 having the above-mentioned structure includes a support plate 125 and a plurality of support frames 126. The support frames 126 are provided under the lower surface of the support plate 125 to support the lower surface of the support plate 125.

In other words, the support frames 126 support the lower surface of the support plate 125 to prevent the support plate 125 from being bent in a thicknesswise direction by the weight of the vane units 130. Furthermore, a plurality of weight reduction holes is formed through each support frame 126 to disperse a load transmitted in the vertical direction, thus preventing the buckling of the support frame 126.

As described above, an aerogenerator having a means for maintaining a vane horizontal according to the present invention can maximize rotating force of vane units by wind, thus increasing the amount of produced electric energy. Furthermore, although the aerogenerator is used over a long period of time, the horizontal maintaining means can prevent the central axes of rotating shafts of the vane units from being deflected downwards by the weights of the vane units. Hence, a satisfactory amount of electric energy can be continuously generated. Moreover, a rotational support base which supports the vane units thereon is slightly bent inwards to more stably support the weight of the vane units, thus more reliably maintaining the vane units horizontal.

What is claimed is:

1. An aerogenerator, comprising:
a support pillar placed upright on ground, the support pillar having a hollow space therein, with a support extension extending a predetermined distance from an upper end of the support pillar inwards such that the hollow space is open on the upper end of the support pillar through a center of the support extension;
a rotational support unit rotatably mounted on the upper end of the support pillar, the rotational support unit including a rotational body having a space therein, and a rotational support base supporting a lower end of the rotational body and having opposite ends extending predetermined lengths from the rotational body outwards;
a vane unit including a main vane and a subsidiary vane provided on the respective opposite ends of the rotational support base of*the rotational support unit, the main vane and the subsidiary vane being rotatable by wind and having different weights;

a generating unit to convert rotating force transmitted from the vane unit into electric energy;

a rotating force transmission unit to transmit the rotating force of the vane unit to the generating unit; and horizontal maintaining means for connecting the vane unit to the rotational body to maintain in a horizontal orientation a central axis of a rotating shaft of the vane unit, wherein the rotational support base of the rotational support unit is bent upwards, so that when the rotational body and the vane unit are coupled to the rotational support base, the rotational support base supports the weight of the vane unit such that the central axis of the rotating shaft of the vane unit is maintained in a horizontal orientation, wherein the rotational support base is constructed such that bending rates of the opposite ends thereof differ from each other, based on a medial portion of the rotational support base on which the rotational body is provided, and wherein a bending rate of one end of the rotational support base which supports thereon the main vane which is heavier than the subsidiary vane is greater than a bending rate of a remaining end of the rotational support base which supports the subsidiary vane.

2. The aerogenerator as set forth in claim 1, wherein the horizontal maintaining means comprises a wire having at least one strand, the wire being coupled at a first end thereof to the rotational body of the rotational support unit, and being coupled at a second end thereof to a predetermined portion of the vane unit fastened to the rotational support base, wherein a length of the wire is adjusted by a length adjustment unit, thus maintaining in a horizontal orientation the central axis of the rotating shaft of the vane unit.

3. The aerogenerator as set forth in claim 1, wherein the horizontal maintaining means comprises:

a first wire having at least one strand, the first wire being fastened to the rotational body of the rotational support unit;

a second wire having at least one strand, the second wire being fastened to a predetermined portion of the vane unit fastened to the rotational support base; and a length adjustment unit connecting the first wire to the second wire, the length adjustment unit pulling or loosening the first wire and the second wire in a longitudinal direction using rotation thereof, thus adjusting an entire length of the first and second wires, so that the central axis of the rotating shaft of the vane unit is maintained in a horizontal orientation by rotating the length adjustment unit.

* * * * *